United States Patent
Reymann et al.

(10) Patent No.: US 9,329,019 B2
(45) Date of Patent: May 3, 2016

(54) APPARATUS FOR DETECTING A MAGNETICALLY CONDUCTIVE OBJECT AND POSITION MEASURING SYSTEM FOR MEASURING THE POSITION OF A GUIDE ROD AND ASSOCIATED POSITION MEASURING METHOD

(71) Applicant: AREVA GMBH, Erlangen (DE)

(72) Inventors: Markus Reymann, Nuremberg (DE); Naeel Muhamad Ali, Erlangen (DE)

(73) Assignee: Areva GmbH, Erlangen (DE)

( * ) Notice: Subject to any disclaimer, the term of this patent is extended or adjusted under 35 U.S.C. 154(b) by 415 days.

(21) Appl. No.: 14/021,450

(22) Filed: Sep. 9, 2013

(65) Prior Publication Data

US 2014/0062464 A1    Mar. 6, 2014

Related U.S. Application Data

(63) Continuation of application No. PCT/EP2012/000835, filed on Feb. 27, 2012.

(30) Foreign Application Priority Data

Mar. 7, 2011    (DE) .......................... 10 2011 013 270

(51) Int. Cl.
    *G01B 7/14*    (2006.01)
    *G01B 7/30*    (2006.01)
    (Continued)

(52) U.S. Cl.
    CPC .............. *G01B 7/003* (2013.01); *G01D 5/2013* (2013.01); *G01D 5/2515* (2013.01); *G01R 33/04* (2013.01); *G21C 7/10* (2013.01); *G21C 17/10* (2013.01); *Y02E 30/39* (2013.01)

(58) Field of Classification Search
    CPC .......... G01B 7/30; G01B 7/14; G01D 5/2515; G01D 5/2013
    USPC ........................................ 324/207.15, 207.13
    See application file for complete search history.

(56) References Cited

U.S. PATENT DOCUMENTS

| 3,237,096 A | 2/1966 | Zechman |
| 3,890,607 A | 6/1975 | Pelenc et al. |

(Continued)

FOREIGN PATENT DOCUMENTS

| CN | 1147677 A | 4/1997 |
| CN | 1808629 A | 7/2006 |

(Continued)

OTHER PUBLICATIONS

International Search Report of PCT/EP2012/000835, Dated June 26, 2012.

(Continued)

*Primary Examiner* — Reena Aurora
(74) *Attorney, Agent, or Firm* — Laurence A. Greenberg; Werner H. Stemer; Ralph E. Locher

(57) ABSTRACT

An apparatus for detecting a magnetically conductive object in a detection area has an electrical coil and at least one sensor element. The apparatus is intended to be as free of degradation processes as possible and thus requires little maintenance and is configured and set up with the highest possible degree of redundancy and measurement reliability. For this purpose, the coil is set up to form a magnetic field in the detection area and the sensor element is configured to detect a magnetic field with a field strength, the magnitude of which is greater than a predefined threshold value. The threshold value is set to be higher than the field strength present in the detection area when the magnetically conductive object is absent and lower than the field strength present therein when the object is present.

17 Claims, 6 Drawing Sheets

(51) Int. Cl.
*G01B 7/00* (2006.01)
*G01D 5/20* (2006.01)
*G01D 5/251* (2006.01)
*G21C 7/10* (2006.01)
*G21C 17/10* (2006.01)
*G01R 33/04* (2006.01)

(56) References Cited

U.S. PATENT DOCUMENTS

| | | | |
|---|---|---|---|
| 4,068,163 | A | 1/1978 | Foxworthy |
| 4,714,926 | A | 12/1987 | Neuner et al. |
| 5,333,160 | A | 7/1994 | Runde |
| 6,580,264 | B2 | 6/2003 | Nekado |
| 6,810,754 | B2 | 11/2004 | May |
| 6,971,264 | B2 | 12/2005 | Morimoto et al. |
| 7,710,112 | B2 * | 5/2010 | Baturin et al. ............. 324/244 |
| 2006/0056575 | A1 | 3/2006 | Mehnert et al. |

FOREIGN PATENT DOCUMENTS

| | | |
|---|---|---|
| DE | 908921 C | 4/1954 |
| DE | 2439170 A1 | 2/1976 |
| DE | 296184 A5 | 11/1991 |
| DE | 4411758 A1 | 10/1995 |
| DE | 19629994 C1 | 10/1997 |
| DE | 10392253 B4 | 11/2006 |
| DE | 60130700 T2 | 7/2008 |
| DE | 102007060615 A1 | 6/2009 |
| DE | 102008009002 A1 | 8/2009 |
| DE | 102008012053 A1 | 9/2009 |
| EP | 1391598 B1 | 8/2007 |
| FR | 2169437 A5 | 9/1973 |
| FR | 2364432 A2 | 4/1978 |
| GB | 1056323 A | 1/1967 |
| RU | 1783924 A1 | 6/1994 |
| SU | 600391 A1 | 3/1978 |

OTHER PUBLICATIONS

Sankov et al., "Examination of the ferro-probe sensors of magnet objects for proximity tracking systems", Vestinik MGTU, N.E. Bauman, Mashinostroyeniye, 2009, No. 2 pp. 90-101—Statement of Relevance, Not in english.

* cited by examiner

APPARATUS FOR DETECTING A MAGNETICALLY CONDUCTIVE OBJECT AND POSITION MEASURING SYSTEM FOR MEASURING THE POSITION OF A GUIDE ROD AND ASSOCIATED POSITION MEASURING METHOD

CROSS-REFERENCE TO RELATED APPLICATION

This is a continuation application, under 35 U.S.C. §120, of copending international application No. PCT/EP2012/000835, filed Feb. 27, 2012, which designated the United States; this application also claims the priority, under 35 U.S.C. §119, of German patent application No. DE 10 2011 013 270.8, filed Mar. 7, 2011; the prior applications are herewith incorporated by reference in their entireties

BACKGROUND OF THE INVENTION

Field of the Invention

The invention relates to an apparatus for detecting a magnetically conductive object and a position measuring system for measuring the position of a guide rod, and to an associated method for measuring the position of a guide rod, in particular a control rod or a drive rod for a control rod in a nuclear plant.

In a nuclear plant, for example in a nuclear power plant, linearly movable control rods are used to control chain reactions of nuclear decay processes in a reactor in the case of which particle radiation—in particular neutron radiation—is emitted, doing so by absorption of the radiation. The more such control rods, which are typically arranged bundled into groups, are pushed between the nuclear fuel elements, the greater the number of components of the particle radiation continuing to drive the chain reaction are absorbed, and so the chain reaction proceeds correspondingly more slowly and is brought to a standstill in the position of full extension of the control rods. It follows that the state and progress of the chain reaction depend on the positions of extension of the linearly movable control rods and are determined by the latter. An accurate knowledge of these positions is therefore relevant to the control of the operating state and thus, in particular, to safety.

Position measuring systems for control rods generally contain measuring apparatuses based on inductive measuring methods or measuring apparatuses with magnetic sensors, in particular Reed contacts.

In the case of an inductive measuring method an alternating electromagnetic field is generated in a primary coil, and the alternating current generated in a secondary coil by induction is measured. The inductance of the control rod moved past the coil pairs influences the time profile of the induction current, as a result of which it is possible to determine the position of the control rod given a suitable arrangement of a plurality of coil pairs along the displacement path or stroke path.

Also known are position measuring systems in the case of which there is fastened on the control rod, for example on the control rod head, a permanent magnet which actuates Reed contacts positioned along the stroke path. A magnetic sensor such as a Reed contact (also denoted as a Reed switch contact or Reed relay) is configured such that given the presence of a sufficiently strong magnetic field in the measurement area of the sensor it makes use of magnetized electrical conductor tongues to form an electrical contact closure which can be detected by a corresponding current flow in the circuit of the Reed contact. Thus, the Reed contact acts as a switch dependent on the magnetic field. It is possible in this way to detect, in particular, stationary magnetic fields whose field strengths overshoot a prescribed threshold value.

A disadvantage of the above-described measuring apparatuses is based on the fact that a permanent magnet arranged on a control rod is exposed to the high temperatures prevailing in a reactor cooling medium, as a result of which degradation processes of the magnetization and of the material of the permanent magnet proceed more quickly than in an environment in which less extreme temperature conditions prevail. Furthermore, it is possible only in a very limited extent to replace or appropriately retrofit permanent magnets on existing systems. A roundabout solution consists in arranging a permanent magnet on a drive rod of a control rod instead of on the control rod itself. Such a solution for a measuring apparatus with Reed contact elements is known, for example, from U.S. Pat. No. 4,068,163. However, the problem of the accessibility and/or retrofittability remains in part. In addition, the redundancy of such a measuring apparatus is limited to a few Reed contact elements. This means that, given a plurality of Reed contacts installed along the stroke path (in order to achieve an appropriate spatial resolution of the position measurement), the only one which closes is always the one which the permanent magnet has just passed, but that it reopens as soon as the control rod is advanced, and the permanent magnet is removed from the area of influence of the Reed contact.

BRIEF SUMMARY OF THE INVENTION

A first object of the invention is to specify a measuring apparatus which can be used to determine the position of a control rod, which during use is as free as possible from degradation processes, and thus is low in maintenance, which manages, while being set up in an existing system, with the least possible intervention in the system, and which can be configured and set up with as high a degree of redundancy and measuring accuracy as possible.

A second object of the invention is to specify a position measuring system for determining a position or a plurality of positions of a control rod movable along a rectilinear path, and which is, as far as possible, of low maintenance and reliable.

A third object of the invention is to specify a method for determining the position of a control rod or of a drive rod for a control rod, which method is as reliable as possible.

The first object is achieved according to the invention by an apparatus for detecting a magnetically conductive object in a detection area. The apparatus has an electrical coil and at least one sensor element, in which the coil is set up to form a magnetic field in the detection area. The sensor element is configured to detect a magnetic field with a field strength whose magnitude overshoots a predefined threshold value. The threshold value being set to be higher than the field strength present in the detection area in the absence of the magnetically conductive object, and lower than the field strength present therein the presence of the object.

Drive rods for control rods are usually formed substantially from magnetically conductive materials, respectively mostly from iron or an iron-containing material, for example steel. The magnetically conductive (permeable) materials include, in particular, ferromagnetic materials whose magnetic permeability μr is greater than 1 by at least a power of ten—for example μr>300 for iron. If an object made from a magnetically conductive material penetrates into the area of a magnetic field, the magnetic flux density of the field, and thus the field itself, is consequently increased there.

The invention proceeds from the idea of using an external electrical coil to provide a magnetic field, and of using a sensor element to detect the variation, that is to say amplification, of the magnetic field which is caused by the presence of a magnetically conductive object in the detection area. For this purpose, the electric current which flows through the coil is set such that the magnitude of the field strength of the generated magnetic coil field still lies below the threshold value at which the sensor element reacts. If a magnetically conductive object approaches the magnetic field, a magnetization of the object takes place and is added to the coil field. The resulting magnetic field strength at the location of the sensor element overshoots the prescribed threshold value upon penetration of the object into the detection area, and so the sensor element responds.

By using an external coil, there is no need for the object to be detected to be magnetized separately—for example, by attaching a permanent magnet to the object—and no need to detect the magnetic field with the aid of a passive sensor system.

It is possible with the aid of the inventive apparatus for the magnetic field generated by the coil to be variably set and deactivated/activated. In particular, it is possible thereby to use different sensor elements with different predefined threshold values in combination with one and the same coil. Furthermore, it is also possible to use a plurality of sensors with different threshold values in combination with one and the same coil, and this simultaneously increases redundancy and the accuracy of detection of the apparatus. If it is known that the object is located in the detection area—if, for example, it has not been moved on after detection has already taken place—the coil field can also be deactivated again. A sensor element which already responds to magnetic fields with a field strength above a lower threshold value may then be used, if appropriate, further to detect the remanescence field of the object magnetized by the coil field, whereby the object can also still be detected passively given a deactivated coil field.

The coil preferably surrounds a coil core in the form of an annular segment made from a magnetically conductive material. The magnetic field of the coil is magnified by a magnetization of the coil core. Furthermore, the form of an annular segment, for example of a semicircular ring, is preferentially suitable for surrounding the detection area.

The coil core is preferably formed substantially from iron or from an iron-containing metal alloy. Iron is cost-effectively available and ferromagnetic. Iron-containing alloys can, moreover, have further suitable material properties which give rise, in particular, to a higher level of ruggedness and wear resistance than in the case of pure iron.

In a preferred embodiment of the apparatus, a or each sensor element is arranged within the detection area or between the coil and the detection area. The variation in the magnetic field which is caused by an object penetrating into the detection area and/or present there is to be seen at its clearest in the areas.

In a particularly suitable design of the apparatus, the sensor element is provided as a contact sensor, in particular as a Reed contact element. A Reed contact element contains two contact tongues whose core is respectively generally formed from a ferromagnetic metal. A magnetic field in the area of the Reed contact element leads to an attraction between the two contact tongues. If the field strength of the magnetic field overshoots a threshold value, a contact closure is formed between the two contact tongues such that an electric control current can flow via the contact. In order to improve the conductivity and to reduce a premature contact closure, the contact tongues are usually coated with a noble metal, for example copper or silver, and are generally enclosed in an evacuated glass bulb, or one filled with protective gas. Reed contact elements are scalable over a wide range of magnitude, and are robust and available cost-effectively.

The second object is achieved by a position measuring system for measuring a position or for measuring a plurality of positions of a guide rod, which is extended with reference to a guide system along a rectilinear path and can be moved along the rectilinear path, and is formed substantially from a magnetically conductive material. The position measuring system has an apparatus or has a plurality of apparatuses of the above-described type in accordance with the first object of the invention.

The position of the guide rod is defined as the position of a reference point that is stationary with reference to the guide rod, the reference point has exactly one variable spatial coordinate with reference to the rectilinear path. The reference point is preferably selected at the location of an end face of the guide rod. Once the end face of the guide rod reaches the detection area of a sensor element and the sensor element reacts thereto, the position of the guide rod in the meaning of the definition corresponds precisely to the detection area of the sensor element with reference to the rectilinear path. The position of the guide rod is uniquely determined down to the spatial resolution of the sensor element.

The specific selection of the reference point at an end face of the guide rod does not constitute a limitation of generality. Given a different selection of the reference point, by comparison with the values relating to the specific selection of the reference point, the measured position values are displaced by a constant length which is given by the distance between the end face and the reference point along the rectilinear path. The position of the guide rod within the meaning of the above definition is used below without limitation of generality.

It is expedient for the apparatus comprised by the position measuring system or the relevant apparatuses to be arranged in accordance with the first object of the invention along the rectilinear path, the or each position of the guide rod which is to be measured being located within the or respectively within a detection area of the or an apparatus.

A or each coil is preferably arranged substantially within an area or within respectively one area about a plane orthogonal to the rectilinear path. In such a geometric arrangement, it is preferably the case that the respective detection area completely surrounds the rectilinear path in conjunction with as low a volume as possible for the detection area. The smaller the volume of a detection area, the more accurate is the spatial resolution of the detection of a magnetically conductive object, and the more accurate is the measurement of the position of the guide rod which is assigned to the detection area in the position measuring system. In a particularly suitable development of the position measuring system, a or a plurality of coils is/are, in particular, provided with a or a plurality of annular coil cores with which the rectilinear path is surrounded in the shape of an annulus.

In a preferred embodiment of the position measuring system, a plurality of coils is arranged along the path uniformly spaced apart from one another. Mutually equidistant positions of the guide rod can be measured in this way.

In a suitable design of the position measuring system, a or each sensor element is connected to the guide system. In particular, the respective sensor element is connected by a contact closure and/or positively to a component of the guide system which is linearly extended and arranged parallel to the rectilinear path.

In a specific variant embodiment of the position measuring system, the guide rod is provided as a drive rod of a control rod of a nuclear plant, and the guide system contains a pressure pipe surrounding the drive rod. The longitudinal axis of the pressure pipe is arranged in this case parallel to the rectilinear path, the distance between the longitudinal axis and the path being small in relation to the diameter of the pressure pipe. In particular, in such an arrangement a or a plurality of sensor elements is/are connected by contact closure and/or positively to the outwardly directed surface of the pressure pipe. In this case, the drive rod forms the magnetic conductive object with a comparatively high permeability μr>>1, while the pressure pipe has only a comparatively low permeability of, for example, μr<2, and therefore has paramagnetic or slightly diamagnetic properties and is "permeable" to an existing magnetic field and varies the latter only insubstantially, in particular slightly attenuates it.

It is preferred for a plurality of coils to be connected in a series circuit to one and the same voltage source. In particular, the result is that the complexity of the circuit and the cabling outlay in the position measuring system is reduced by comparison with a separate provision of voltage for each coil, or that the level of redundancy of the position measuring system is increased in the case of no change in circuit complexity.

In a further, suitable design of the position measuring system, the coil or a plurality of coils is/are connected in a series circuit to a second coil arranged along the rectilinear path. In such an arrangement, the voltage supply is implemented via a secondary circuit which is set up to supply the second coil, a separate power supply to the coil or coils via one or more primary circuits being omitted. Such an arrangement minimizes the number of supply lines, and in addition it is possible to operate the position measuring system in conjunction with a further apparatus for position measurement of a guide rod, for example with an inductive measuring apparatus.

The third object is achieved by a method for measuring a position or for measuring a plurality of positions of a guide rod, which is extended with reference to a guide system along a rectilinear path and can be moved along the rectilinear path, and is formed substantially from a magnetically conductive material. A position measuring system in accordance with the second object of the invention is provided. An electric current is conducted through one or more coils, the magnetic field induced by the electric current in a or in a plurality of detection area(s) being varied by the guide rod at the position or at a plurality of positions, and the variation in the magnetic field in the detection area(s) being detected upon overshooting of the predefined threshold value or values.

In the description so far, reference has been made above all to the case in which the field-generating coils are fed with direct current, with the result that stationary magnetic fields are generated. In an alternative design of the method, an alternating current is conducted through a coil or through a plurality of coils. An alternating current induces an alternating magnetic field in the or in each coil. The statements so far continue to apply, with the difference that the field strength of the magnetic fields is to be substituted by the amplitudes of the appropriate alternating magnetic fields. The or each sensor element then, as previously, supplies no output signal when the amplitude of the field is smaller than the threshold value, and supplies an oscillating output signal when the amplitude of the field is bigger than the threshold value. In other words, it is then evaluated whether the sensor contact is oscillating, or whether it is continuously open. Such a design of the method is suitable for combining with a second, diversitary measuring method, for example with an inductive measuring method in which the power supply of the coil(s) is implemented via the power supply for the further measuring method, for which an alternating current is required. Such a combination increases the redundancy and reliability in conjunction with an unaltered number of power supply lines that must be led out of the measurement area.

The advantages attained with the invention consist, in particular, in that the use of a number of Reed contacts fitted outside a pressure pipe of low magnetic permeability enables a particularly reliable detection of the position of a control rod guided in the pressure pipe, or of a drive rod for a control rod. According to the invention, the magnetic field provided for actuating the Reed contacts is not generated via permanent magnets fitted on the control rod or on the drive rod, but by a field-generating coil fitted outside the pressure pipe and preferably having a ferromagnetic core, specifically iron core. The field strength is selected in this case in such a way that in the absence of the magnetically conductive control rod or the magnetically conductive drive rod the Reed contacts do not yet respond, that is to say are still open, for example. As soon as the head end of the control rod or the drive rod is pushed past the respective Reed contact, the comparatively high permeability thereof causes an increase in the magnetic field in the detection area of the contact such that the Reed contact closes. In other words: the amplifying effect of the magnetically conductive control rod or of the drive rod is used to vary the strength of the outer, electrically generated magnetic field, thus enabling the position detection of the control rod or of the drive rod.

By contrast with the variant having field-generating permanent magnets, the Reed contact remains closed when the control rod or the drive rod is pushed further ahead, that is to say, together with the other Reed contacts already passed by the control rod head or drive rod head, it permanently indicates the position so far reached (redundancy of the display).

Since no variation is to be undertaken at the control rod head or drive rod head, that is to say no permanent magnet need be fitted, the system according to the invention is particularly suitable for retrofitting old plants.

The concept is, furthermore, particularly suitable for combining with an inductive measuring method. In an inductive measuring method, a primary coil is to be excited by applying alternating current such that an alternating electromagnetic field is generated. If the excitation coils of the measuring system based on Reed contacts are connected in series with the primary coils of the inductive measuring system, it is then possible for the magnetic field required to actuate the Reed contacts to be already provided in the form of an alternating field. In other words, the excitation of the coils assigned to the Reed contacts is performed via the primary coil circuit of the inductive measuring system. During a suitable design of the Reed contact, specifically given suitably selected inertia of the contact tongues, an oscillating output signal is produced at this contact by the ferromagnetic field increase once the control rod has been inserted. The need then is not to evaluate on a permanently closed or open contact, but rather to check whether the contact is oscillating, or whether it is permanently open, in order to derive the desired statement of position therefrom.

Furthermore, given such a combination with an inductive measuring system, the output contacts of the Reed relay can be connected to the secondary coil circuit, and the signal evaluation can be performed via the secondary coil circuit so that there is multiple use of the signal paths.

Other features which are considered as characteristic for the invention are set forth in the appended claims.

Although the invention is illustrated and described herein as embodied in an apparatus for detecting a magnetically conductive object and a position measuring system for measuring the position of a guide rod and an associated position measuring method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE INVENTION

Figure 1:
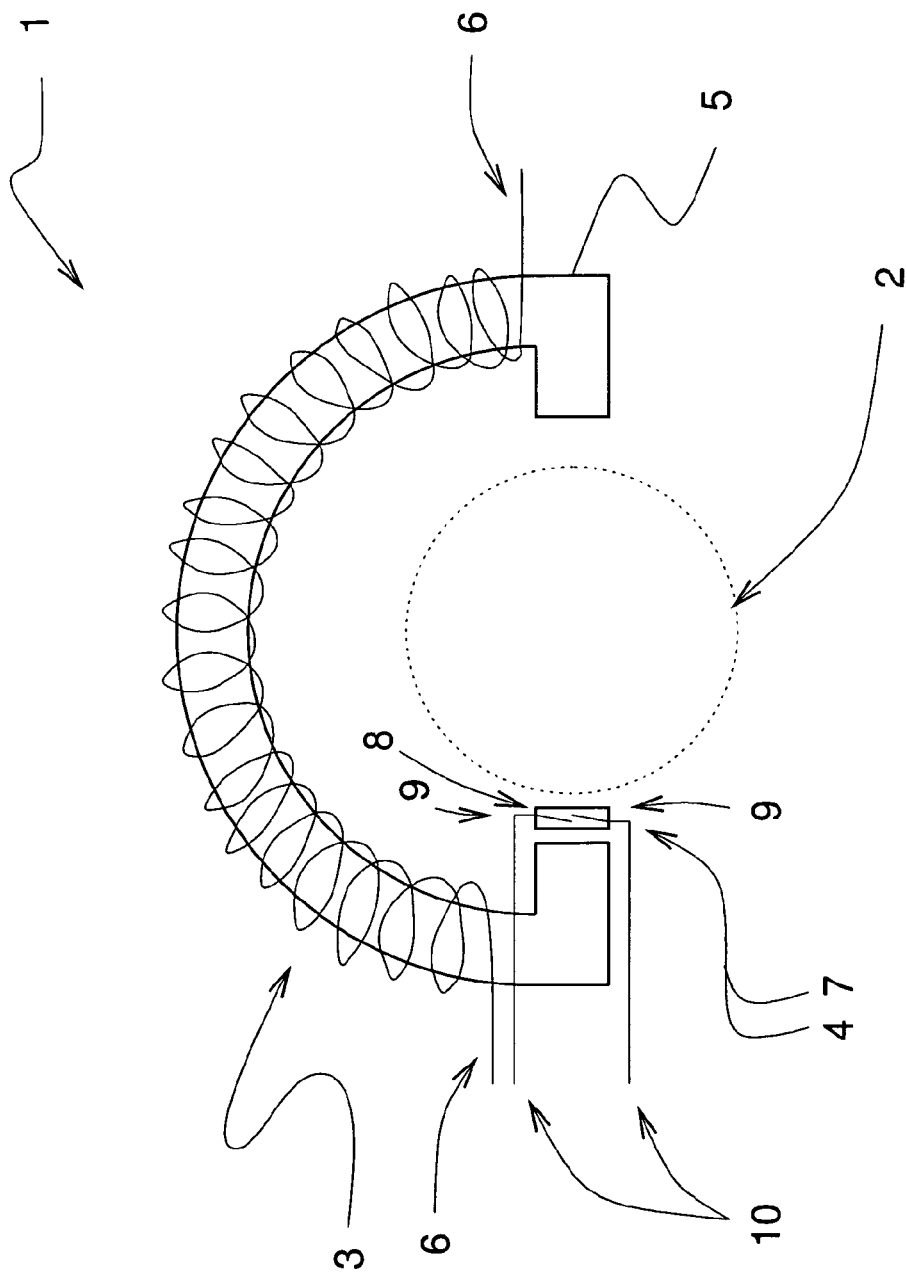
FIG. 1 is a diagrammatic, cross-sectional view of an apparatus for detecting a magnetically conductive object according to the invention.

Mutually corresponding parts in FIG. 1 to FIG. 6 are provided with identical reference numerals.

Referring now to the figures of the drawings in detail and first, particularly to FIG. 1 thereof, there is shown a cross-sectional illustration of an apparatus 1 for detecting a magnetically conductive object in a detection area 2. The apparatus 1 contains an electrical coil 3 and a sensor element 4. The electrical coil 3 is formed from an electrical conductor 6 wound around a coil core 5, for example from an insulated copper wire. The semicircular coil core 5, which embraces the detection area 2, is formed from a ferromagnetic material, for example from iron. The sensor element 4 is arranged between the detection area 2 and the coil core 5, and is configured as a Reed contact element 7 which has two contact ends 9, which are enclosed in a glass bulb 8 and are respectively connected to an electrical conductor 10. Both contact ends 9 are formed from a ferromagnetic material.

Figure 2:
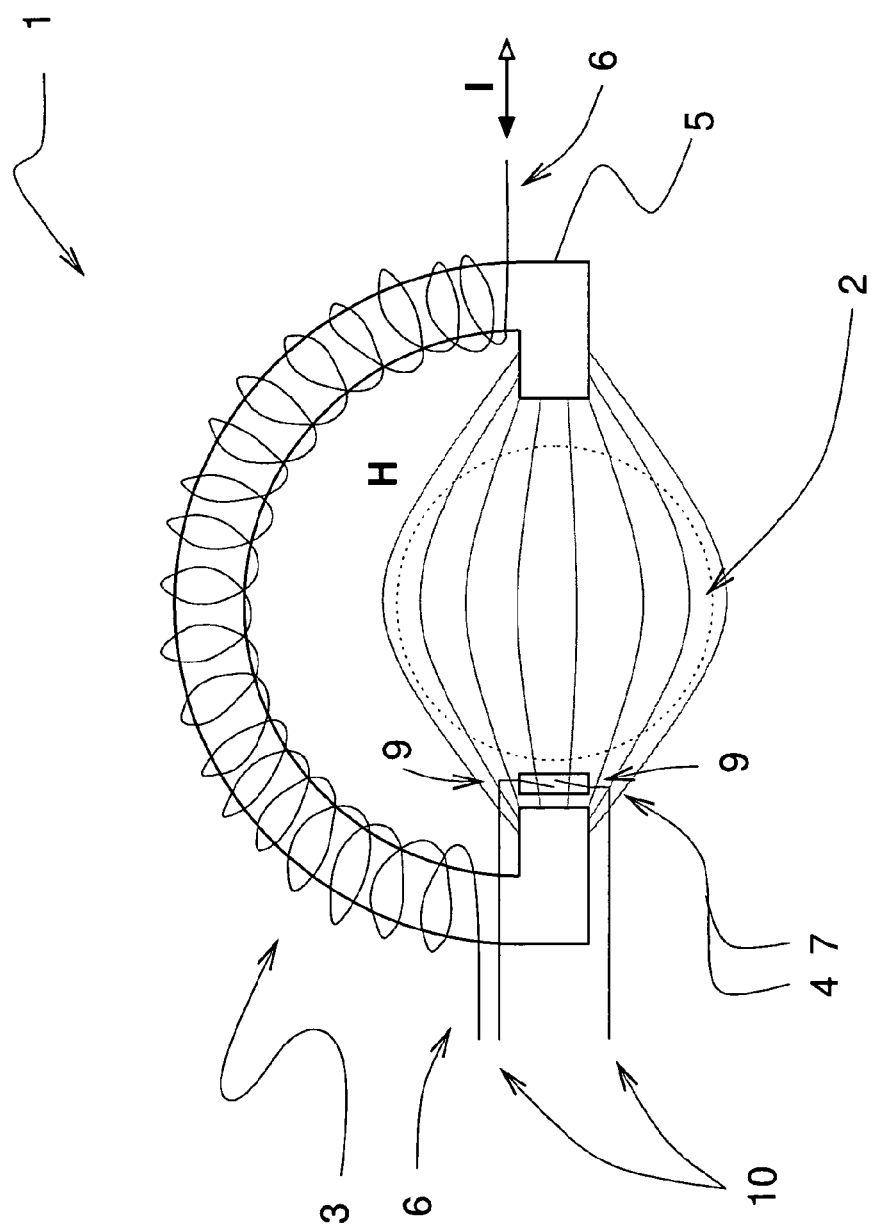
FIG. 2 is a diagrammatic, cross-sectional view of the apparatus according to FIG. 1 with a switched-on electric current and a magnetic field generated thereby.

FIG. 2 illustrates the apparatus 1 according to FIG. 1, the electrical conductor 6, and thus the electrical coil 3, being flowed through by an electric current I which generates a magnetic field H. The effect of the semicircular ferromagnetic coil core 5 is to amplify the magnetic field H and to embrace the detection area 2 between the end faces of the coil core 5, this being evident in the illustration from the profile of the field lines of the magnetic field H. The two contact ends 9 of the sensor element 4 configured as the Reed contact element 7 are magnetized by the magnetic field H and attract one another. The distance between the contact ends is determined by the equilibrium resulting from the force of magnetic attraction between the contact ends 9 and the mechanical restoring force, the restoring force acting in the direction of the neutral distance between the contact ends 9, in accordance with FIG. 1. The contact ends 9 form a contact closure only once the field strength of the magnetic field H at the location of the sensor element 4 reaches and/or overshoots a critical threshold value (compare FIG. 3). In the present illustration in accordance with FIG. 2, the electric current I is set such that the strength of the magnetic field H at the location of the sensor element 4 is just below the critical threshold value such that the two contact ends 9 (yet) break contact.

Figure 3:
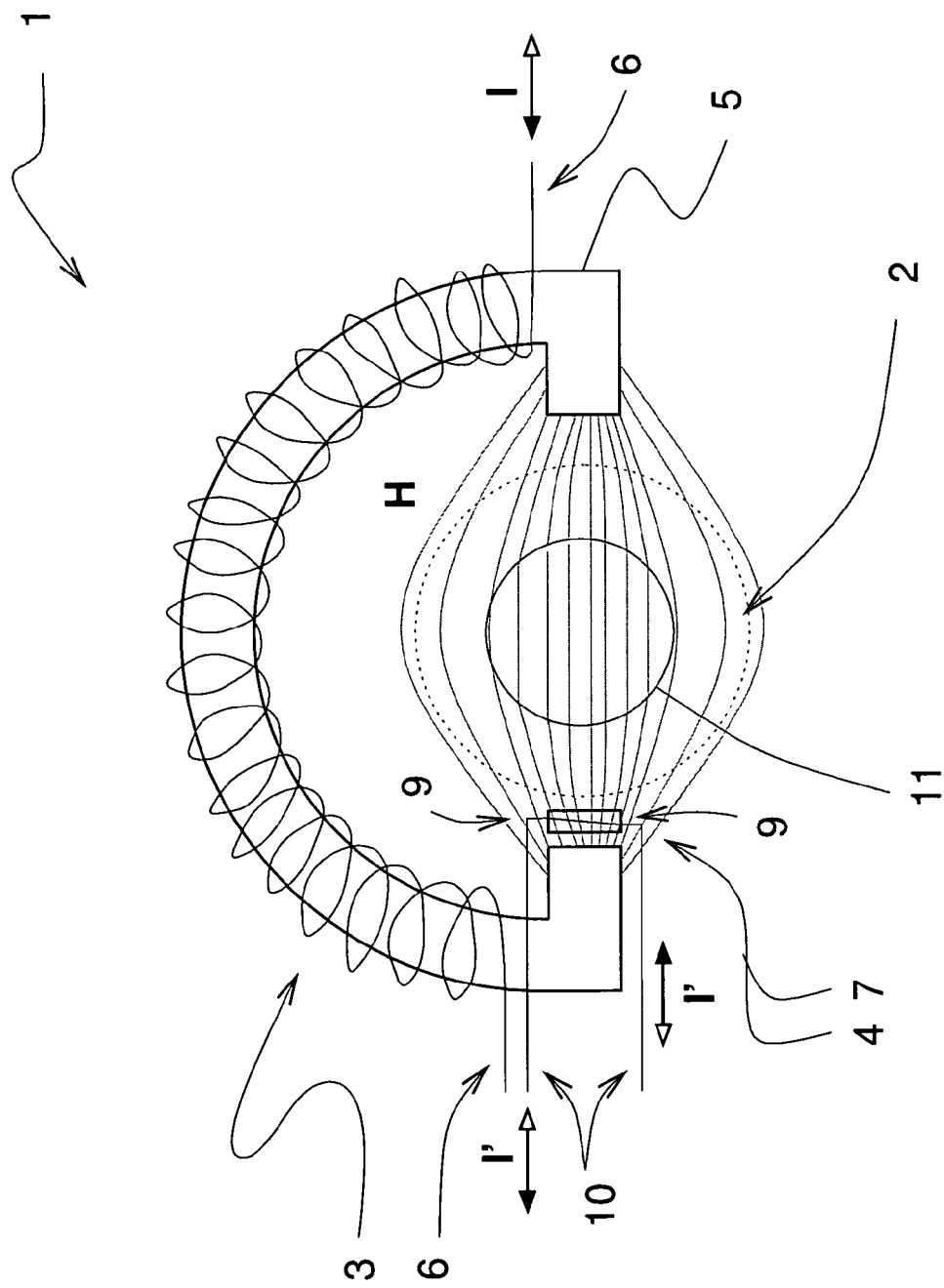
FIG. 3 is a diagrammatic, cross-sectional view of the apparatus according to FIG. 2 with the magnetically conductive object in a detection area.

The apparatus 1 according to FIG. 2 is illustrated in FIG. 3, a magnetically conductive object 11 being arranged in the detection area 2. The magnetic field H penetrates and magnetizes the magnetically conductive object 11. The field strength of the magnetic field H is thereby increased, particularly at the location of the sensor element 4, and the critical threshold value is overshot. The two contact ends 9 of the sensor element 4 form a contact closure, thus enabling there to flow through the two electrical conductors 10 an electric signal current I' which marks detection of the magnetically conductive object 11 in the detection area 2.

Figure 4:
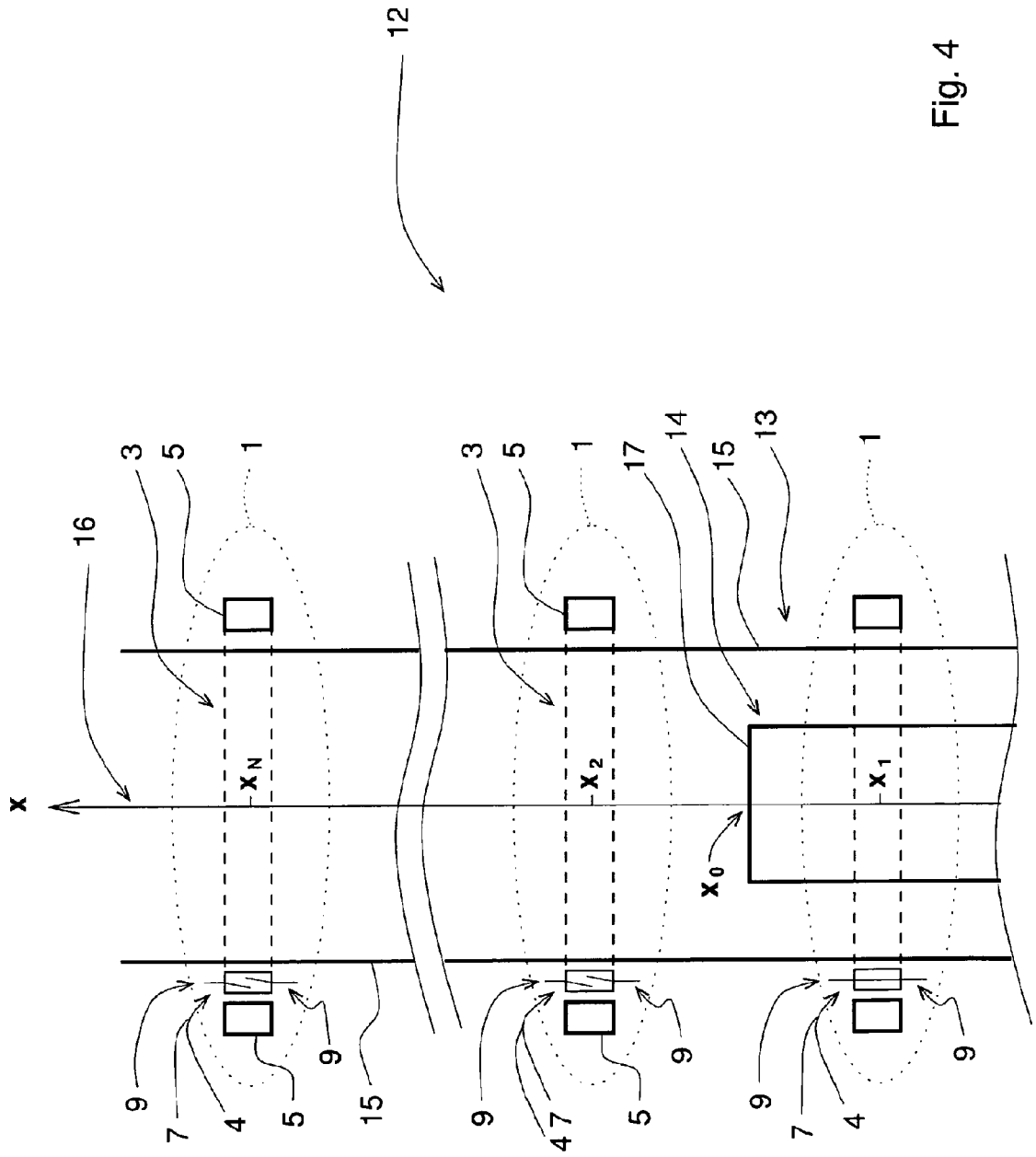
FIG. 4 is a diagrammatic, longitudinal sectional view of a position measuring system for measuring a number of positions x1, x2, . . . , xN of a guide rod.

FIG. 4 shows a longitudinal sectional illustration of a position measuring system 12 for measuring a plurality of positions x1, x2, . . . , xN, fixed with reference to a guide system 13, of a guide rod 14, which is extended with reference to the guide system 13 along a rectilinear path x and can be moved along the rectilinear path x, and is formed substantially from a magnetically conductive material, having a plurality of apparatuses 1 in accordance with FIG. 1 to FIG. 3. The guide system 13 contains a guide tube 15 whose central longitudinal axis 16 is parallel to and on the path x. The apparatuses 1 are arranged with reference to the path x in a fashion uniformly spaced apart from one another, the planes of projection in FIG. 1 to FIG. 3 being arranged orthogonally in relation to the central longitudinal axis 16 and to the path x, respectively at the positions x1, x2, . . . , xN. The guide rod 14 contains a magnetically conductive drive rod 17. A position of the guide rod 14 is defined as the position of a reference point x0 with reference to the path x, the point being fixed in relation to the guide rod 14. The reference point x0 is located at an end face (head or front surface) of the drive rod 17. If the reference point x0 coincides with one of the fixed positions x1, x2, . . . , xN, the guide rod 13 is at the respective position by definition. Located respectively at the fixed positions x1, x2, . . . , xN is exactly one apparatus 1, marked by the dashed area in the illustration. The components of the apparatuses 1 that are visible in this illustration respectively contain the coil 3 with coil core 5, and the sensor element 4, configured as a Reed contact element 7, with the contact ends 9.

In concrete terms, the guide rod 14 is, for example, a drive rod for a control rod or a control element of a nuclear reactor. The guide rod is made from a material of high magnetic permeability $\mu r \gg 1$. The guide tube 14 surrounding the guide rod 13 forms a pressure pipe penetrating the reactor pressure vessel (not illustrated) of the nuclear reactor, and is made from a material of low permeability $\mu r \approx 1$. By contrast with the schematic of FIG. 4, the annular gap between the guide rod 13 and the guide tube 14 can be kept narrow.

Once the end face (the upper head piece) of the magnetically conductive drive rod 17 reaches one of the fixed positions x1, x2, . . . , xN, magnetization of the drive rod 17 and the resulting field enhancement of the magnetic field H and increase in the magnetic flow in the air gap between the guide tube 14 and the coil core 5 produce a contact closure in the Reed contact element 9 of the apparatus 1, which is arranged at the respective position x1, x2, ..., xN. Consequently, at the moment of contact closure the position of the guide rod 14 is therefore uniquely known down to the spatial resolution of the Reed contact element 7. In the present illustration, the end face of a drive rod 17 lies with the reference point x0 between the fixed positions x1 and x2. The contact ends 9 of the Reed contact element 7 of the apparatus 1 are closed at the position x1, while the contact ends 9 of the Reed contact element 7 of the nearest adjacent apparatus 1 are open at the position x2, which means that the position x2 is not yet reached and therefore also not yet detected. The position of the drive rod 17, and thus the position of the guide rod 14, is therefore known as far as the distance between the adjacent positions x1 and x2. The exact position can be determined, for example, by measurement of the speed of movement and of the duration of movement of the guide rod 14, for example with the aid of a device for an inductive measuring method, see FIG. 5. When the guide rod 14 is pushed further upwards, a previously closed Reed contact element 9 remains closed (at least as long as the lower head end of the guide rod 14 has not yet passed this Reed contact element 9, but this does not happen in practice, because of suitable length dimensions and the existence of stops).

Figure 5:
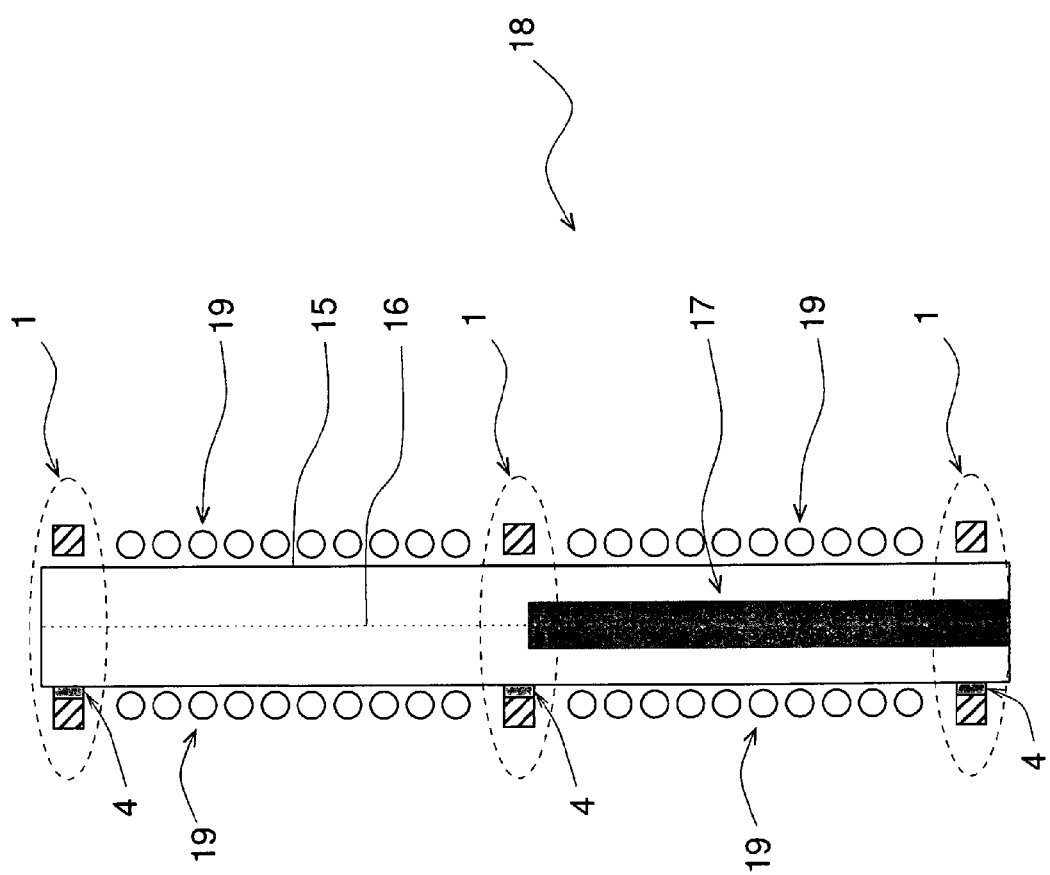
FIG. 5 is a diagrammatic, longitudinal sectional view of a further position measuring system, in which the measuring method of the position measuring system in accordance with FIG. 4 is combined with a measuring method differing therefrom.

FIG. 5 is a longitudinal sectional illustration of a further position measuring system 18 having a magnetically conductive drive rod 17, which is movable in a pressure-stable guide tube 15 along the central longitudinal axis 16, and having apparatuses 1 according to FIG. 1 to FIG. 3 which are arranged with reference to the central longitudinal axis 16 uniformly spaced apart from one another, the sensor elements 4 of the apparatuses being connected to the guide tube 15 with contact closure. In addition to the apparatuses 1, which together with a non-illustrated electronic evaluation unit form a first position measuring system for determining the position of the drive rod 17 in the guide tube 15, a second position measuring system with a diversitary functional principle, specifically with an inductive functional principle, is provided. The second position measuring system contains a number of further induction coils 19, which are arranged concentrically around the guide tube and, as primary coils of the inductive position measuring system, are energized with alternating current. In a preferred refinement, the induction coils 19 and the coils of the apparatuses 1 based on Reed contacts are connected electrically in series. That is to say, the coils of the position measuring system based on Reed contacts are also energized with alternating current, this being taken into account in the evaluation of the signals of the sensor elements 4 to an extent that a check is made as to whether the respective Reed contact is oscillating, or whether it is permanently closed.

Figure 6:
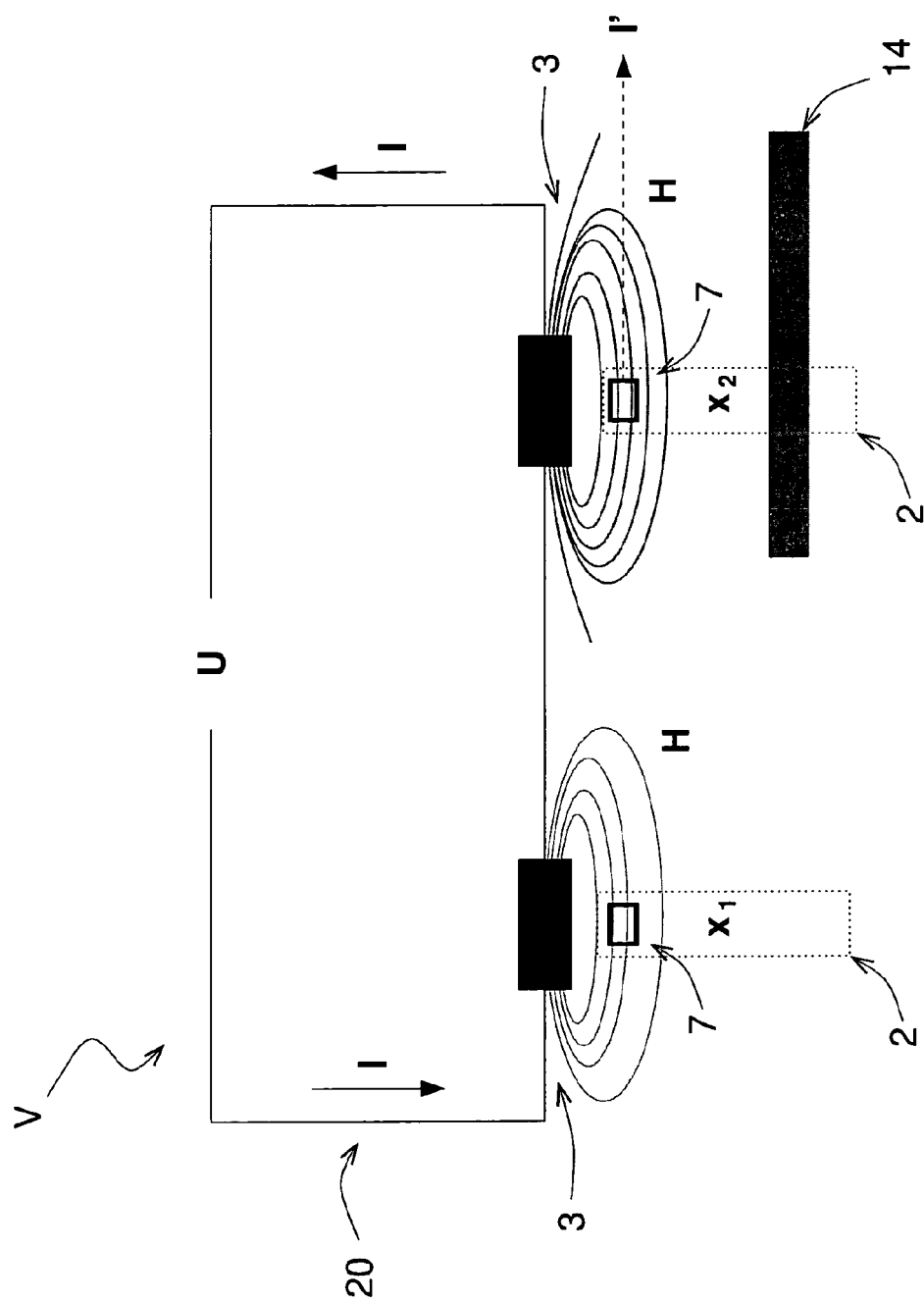
FIG. 6 is a schematic illustration of a position measuring system with a plurality of electrical coils in a series circuit and with Reed contact elements.

FIG. 6 is a schematic of a series circuit 20 with two electrical coils 3 and two Reed contact elements 7. The coils 3 are assigned to the positions x1 and x2 of the position measuring system 1, compare FIG. 4. In the course of the method V, the voltage source U is used to feed an electric current I into the series circuit 20. A magnetic field H is respectively induced in the coils 3 in the region of the positions x1 and x2. The guide rod 14 is located in the detection area 2 assigned to the position x2, and amplifies the magnetic field H at the location of the corresponding Reed contact element 7. The threshold value of the Reed contact element 7 is overshot, and this triggers a signal current I' by contact closure. The signal current I' marks the detection of the guide rod 14 in the detection area 2 of the Reed contact element at the position x2.

The invention claimed is:

1. An apparatus for detecting a magnetically conductive object in a detection area, the apparatus comprising:
    an electrical coil for forming a magnetic field in the detection area;
    a coil core having a form of an annular segment and made from a magnetically conductive material, said electric coil surrounding said coil core; and
    at least one sensor element for detecting the magnetic field with a field strength having a magnitude greater than a predefined threshold value, the predefined threshold value being set to be higher than a given field strength present in the detection area in an absence of the magnetically conductive object, and lower than the field strength present there in a presence of the magnetically conductive object.

2. The apparatus according to claim 1, wherein said coil core is formed substantially from a material selected from the group consisting of iron and an iron-containing metal alloy.

3. The apparatus according to claim 1, wherein said sensor element is disposed one of within the detection area or in an area between said electric coil and the detection area.

4. The apparatus according to claim 1, wherein said sensor element is a contact sensor.

5. The apparatus according to claim 1, wherein said sensor element is a Reed contact element.

6. A position measuring system for measuring a position or for measuring a plurality of positions of a guide rod being extended with reference to a guide system along a rectilinear path and can be moved along the rectilinear path, and formed substantially from a magnetically conductive material, the position measuring system comprising:
    at least one apparatus for detecting a magnetically conductive object in a detection area, said apparatus containing at least one electrical coil for forming a magnetic field in the detection area and a coil core having a form of an annular segment and made from a magnetically conductive material, said electric coil surrounding said coil core, said apparatus further having at least one sensor element for detecting the magnetic field with a field strength having a magnitude greater than a predefined threshold value, the predefined threshold value being set to be higher than a given field strength present in the detection area in an absence of the magnetically conductive object, and lower than the field strength present there in a presence of the magnetically conductive object.

7. The position measuring system according to claim 6, wherein the position or each position is disposed within the detection area.

8. The position measuring system according to claim 6, wherein said at least one electric coil is disposed substantially within an area about a plane orthogonal to the rectilinear path.

9. The position measuring system according to claim 6, wherein said electrical coil is one of a plurality of coils disposed along the rectilinear path uniformly spaced apart from one another.

10. The position measuring system according to claim 6, wherein said sensor element is connected to the guide system.

11. The position measuring system according to claim 6, wherein:
    the guide rod is provided as a drive rod of a control rod of a nuclear plant; and
    the guide system has a guide tube surrounding the drive rod.

12. The position measuring system according to claim 6, wherein said electrical coil is one of a plurality of coils connected in a series circuit to one and a same voltage source.

13. The position measuring system according to claim 6, further comprising an induction coil disposed along the rectilinear path, said electrical coil is connected in a series circuit to said induction coil.

14. The position measuring system according to claim 6, wherein said apparatus is one of a plurality of apparatuses.

15. A method for measuring a position or for measuring a plurality of positions of a guide rod, which is extended with reference to a guide system along a rectilinear path and can be moved along the rectilinear path, and is formed substantially from a magnetically conductive material, which comprises the steps of:

providing a position measuring system with at least one apparatus for detecting a magnetically conductive object in a detection area, the apparatus containing at least one electrical coil for forming a magnetic field in the detection area and a coil core having a form of an annular segment and made from a magnetically conductive material, the electric coil surrounding the coil core, the apparatus further having at least one sensor element for detecting the magnetic field with a field strength having a magnitude greater than a predefined threshold value, the predefined threshold value being set to be higher than a given field strength present in the detection area in an absence of the magnetically conductive object, and lower than the field strength present there in a presence of the magnetically conductive object;

conducting an electric current through the at least one electric coil;

varying the magnetic field generated by the electric current the detection area by the guide rod at the position; and detecting a variation in the magnetic field in the detection area upon overshooting of the predefined threshold value.

16. The method according to claim 15, which further comprises conducting an alternating electric current through the electrical coil.

17. The method according to claim 15, wherein in the position measuring system the apparatus is one of a plurality of apparatuses.

* * * * *